(12) United States Patent
Deng et al.

(10) Patent No.: US 12,096,747 B2
(45) Date of Patent: Sep. 24, 2024

(54) ORGANISM MONITORING DEVICES AND ORGANISM MONITORING METHODS

(71) Applicant: Battelle Memorial Institute, Richland, WA (US)

(72) Inventors: Z. Daniel Deng, Richland, WA (US); Jun Lu, Richland, WA (US); Huidong Li, Richland, WA (US); Jayson J. Martinez, Kennewick, WA (US); Mitchell J. Myjak, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 419 days.

(21) Appl. No.: 17/189,095

(22) Filed: Mar. 1, 2021

(65) Prior Publication Data
US 2022/0272942 A1 Sep. 1, 2022

(51) Int. Cl.
*H01Q 1/50* (2006.01)
*A01K 11/00* (2006.01)
(Continued)

(52) U.S. Cl.
CPC ............. *A01K 11/006* (2013.01); *H01Q 1/50* (2013.01); *H03H 7/38* (2013.01); *H03H 11/28* (2013.01); *H05K 1/025* (2013.01)

(58) Field of Classification Search
None
See application file for complete search history.

(56) References Cited

U.S. PATENT DOCUMENTS

| | | | | |
|---|---|---|---|---|
| 5,226,061 A | * | 7/1993 | Van der Veen | .......... H01Q 9/32 375/309 |
| 5,697,384 A | | 12/1997 | Miyawaki et al. | |

(Continued)

FOREIGN PATENT DOCUMENTS

| | | | | |
|---|---|---|---|---|
| CA | 3021293 C | * | 2/2023 | .......... A01K 11/007 |
| EP | 2037396 | | 3/2009 | |

(Continued)

OTHER PUBLICATIONS

WO PCT/US2016/055045 Search Rept., Feb. 7, 2017, Battelle Memorial Institute.
(Continued)

*Primary Examiner* — Anh Q Tran
(74) *Attorney, Agent, or Firm* — Wells St. John P.S.

(57) ABSTRACT

Organism monitoring devices and organism monitoring methods are described. According to one aspect, an organism monitoring device includes a housing configured to be physically associated with an organism to be monitored, an antenna, signal generation circuitry comprising an oscillator configured to generate an oscillation signal, and an output node configured to output the oscillation signal, impedance matching circuitry coupled with the housing, the antenna and the signal generation circuitry, and wherein the impedance matching circuitry is configured to match an impedance of the signal generation circuitry and an impedance of the antenna, and wherein the impedance matching circuitry is further configured to receive the oscillation signal and to provide the oscillation signal to the antenna, and wherein the antenna is configured to emit a wireless signal externally of the organism monitoring device as a result of the provision of the oscillation signal to the input of the antenna.

31 Claims, 21 Drawing Sheets

(51) Int. Cl.
*H03H 7/38* (2006.01)
*H03H 11/28* (2006.01)
*H05K 1/02* (2006.01)

(56) References Cited

U.S. PATENT DOCUMENTS

| | | | |
|---|---|---|---|
| 9,055,733 B2 * | 6/2015 | Jones, II | A01K 11/008 |
| 10,033,469 B2 | 7/2018 | Deng et al. | |
| 10,067,112 B2 | 9/2018 | Deng et al. | |
| 10,101,429 B2 | 10/2018 | Deng et al. | |
| 10,231,644 B2 | 3/2019 | Rettedal et al. | |
| 10,236,920 B2 | 3/2019 | Deng et al. | |
| 10,531,639 B2 | 1/2020 | Deng et al. | |
| 10,548,509 B2 | 2/2020 | Rettedal et al. | |
| 11,139,840 B2 | 10/2021 | Deng et al. | |
| 11,278,004 B2 | 3/2022 | Deng et al. | |
| 11,355,005 B2 | 6/2022 | Deng et al. | |
| 11,381,263 B2 | 7/2022 | Deng et al. | |
| 11,533,818 B2 | 12/2022 | Deng et al. | |
| 2002/0036569 A1 * | 3/2002 | Martin | G08B 21/0222 340/572.1 |
| 2006/0044134 A1 * | 3/2006 | Elliott | G08B 13/2434 340/687 |
| 2007/0103314 A1 | 5/2007 | Geissler | |
| 2009/0073802 A1 | 3/2009 | Nizzola et al. | |
| 2012/0134239 A1 | 5/2012 | Struthers | |
| 2012/0277550 A1 | 11/2012 | Rosenkranz et al. | |
| 2013/0197323 A1 | 8/2013 | Rettedal et al. | |
| 2013/0253612 A1 * | 9/2013 | Chow | A61N 1/3787 607/60 |
| 2015/0063072 A1 | 3/2015 | Deng et al. | |
| 2015/0375041 A1 * | 12/2015 | Richley | G06F 16/951 340/870.07 |
| 2016/0360994 A1 * | 12/2016 | Rettedal | A61B 5/073 |
| 2019/0200896 A1 | 7/2019 | Rettedal et al. | |
| 2020/0133481 A1 | 4/2020 | Rettedal et al. | |
| 2020/0358067 A1 | 11/2020 | Xiao et al. | |
| 2021/0148881 A1 | 5/2021 | Deng et al. | |
| 2022/0079116 A1 | 3/2022 | Deng et al. | |
| 2022/0361460 A1 | 11/2022 | Deng et al. | |

FOREIGN PATENT DOCUMENTS

| | | | |
|---|---|---|---|
| GB | 2188028 | 9/1987 | |
| WO | WO 2011/079338 | 7/2011 | |
| WO | WO-2012054085 A3 * | 7/2012 | A01K 11/007 |
| WO | WO 2016/201242 | 12/2016 | |
| WO | PCT/US2016/055045 | 6/2018 | |

OTHER PUBLICATIONS

WO PCT/US2016/055045 Writ. Opin., Feb. 7, 2017, Battelle Memorial Institute.
Deng et al., U.S. Appl. No. 62/267,797, filed Dec. 15, 2015, titled "Signal Transmitter and Methods for Transmitting Signals from Animals", 31 pages.
Holohil Systems Ltd., "Holohil LB-2X", available online at https://www.holohil.com/transmitters/lb-2x/, Sep. 10, 2019, 3 pages.
Wikipedia, "Ground Plane", available online at https://en.wikipedia.org/wiki/Ground_plane, Feb. 23, 2021, 3 pages.
Wikipedia, "Impedance Matching", available online at https://en.wikipedia.org/wiki/Impedance_matching, Jan. 25, 2021, 13 pages.
Wikipedia, "Maximum Power Transfer Theorum", available online at https://en.wikipedia.org/wiki/Maximum_power_transfer_theorem, Jan. 26, 2021, 7 pages.
Rettedal et al., U.S. Appl. No. 61/455,419, filed Oct. 19, 2010, titled "Animal Monitoring System", 48 pages.

* cited by examiner

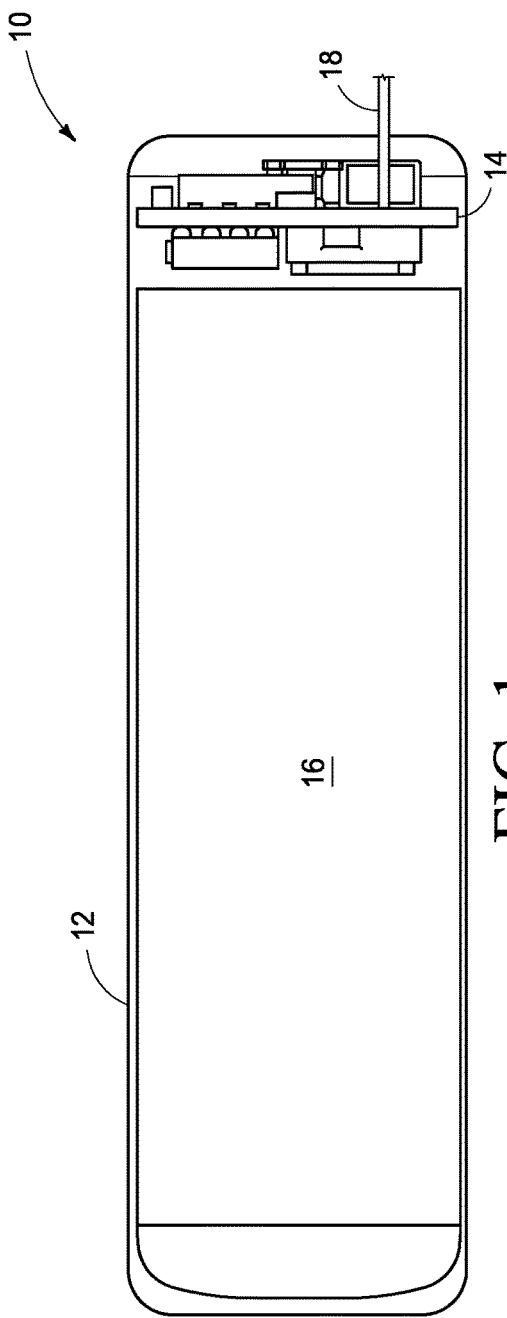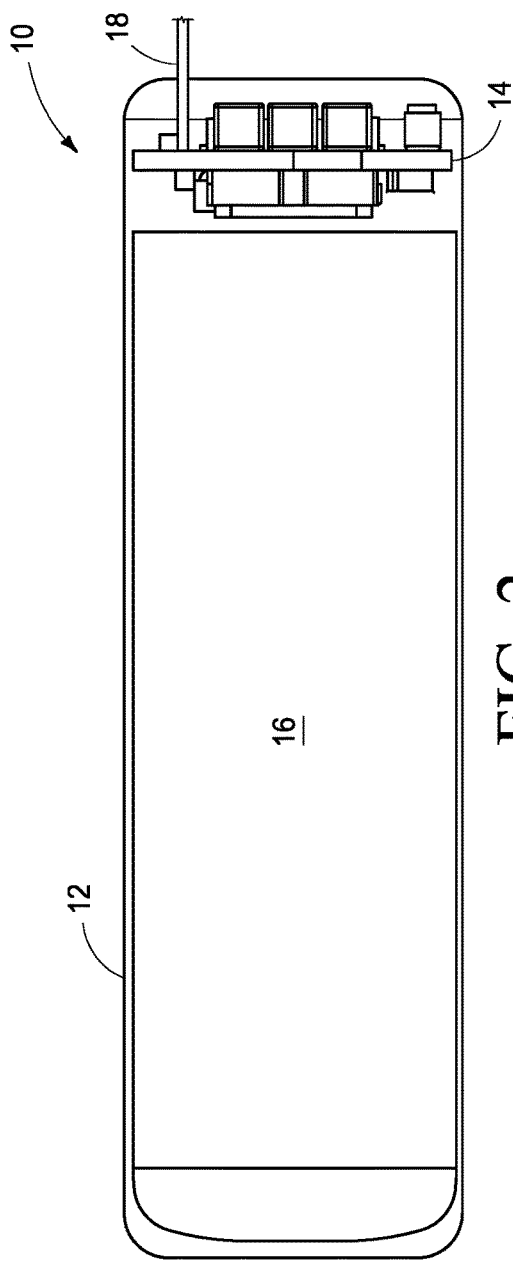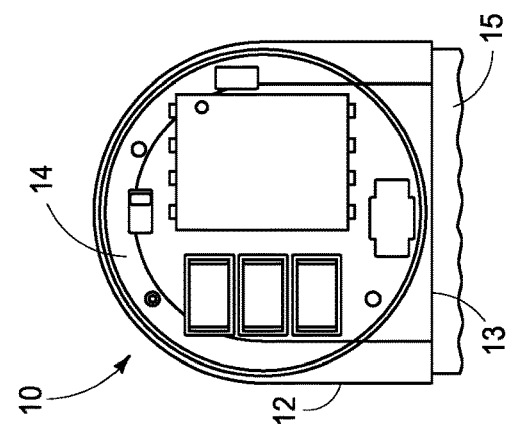

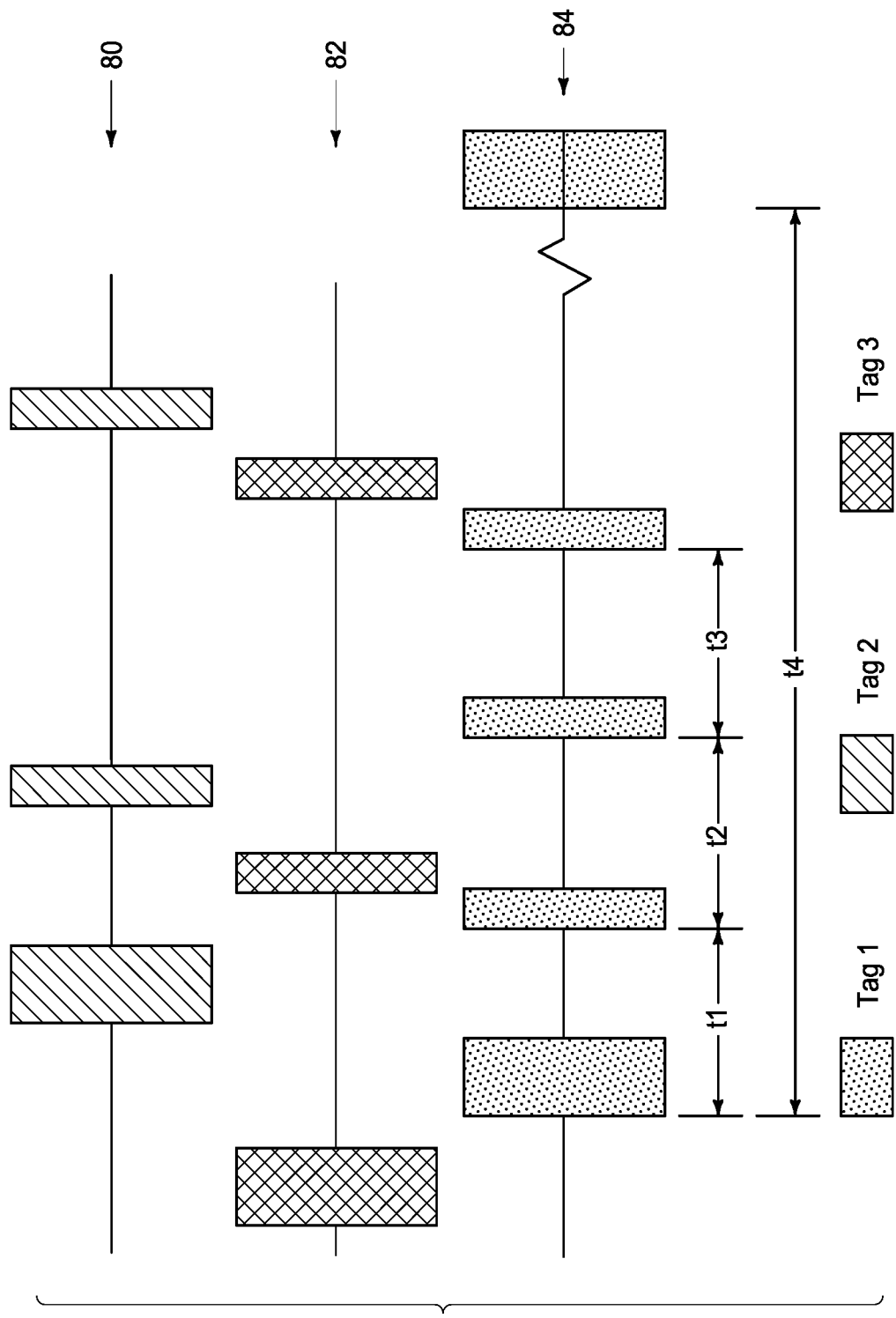

ORGANISM MONITORING DEVICES AND ORGANISM MONITORING METHODS

STATEMENT AS TO RIGHTS TO INVENTIONS MADE UNDER FEDERALLY-SPONSORED RESEARCH AND DEVELOPMENT

This invention was made with Government support under Contract DE-AC05-76RL01830 awarded by the U.S. Department of Energy. The Government has certain rights in the invention.

TECHNICAL FIELD

This disclosure relates to organism monitoring devices and organism monitoring methods.

BACKGROUND OF THE DISCLOSURE

The present disclosure is directed to organism monitoring devices that are useable to monitor various organisms, such as bats and birds as well as aquatic species such as fish. The organism monitoring devices may be attached to the body of the organism being monitored and thereafter emit wireless signals from the device and organism. The emitted signals may be received by one or more receivers within the environment of the organism and be used to monitor for the presence of the organism. In more specific example applications, the organism monitoring devices may be utilized to monitor three main bat species including hoary, eastern red and silver-haired bats that are most frequently killed by wind turbines.

Examples of the organism monitoring devices described herein are relatively small in size and light in weight to avoid negatively impacting the behavior of the organisms being monitored. It has been suggested that the transmitter weight should not exceed 5% of the body weight of birds and transmitter weight should be less than 5% of a bats' body weight.

At least some of the aspects of the disclosure described herein are directed towards organism monitoring devices and organism monitoring methods.

BRIEF DESCRIPTION OF THE DRAWINGS

Example embodiments of the disclosure are described below with reference to the following accompanying drawings.

FIG. 1 is a top view of an organism monitoring device according to one embodiment.

FIG. 2 is a bottom view of an organism monitoring device according to one embodiment.

FIG. 3 is a side view of an organism monitoring device according to one embodiment.

FIG. 25 is an illustrative representation of an example coding scheme of wireless transmissions of an organism monitoring device.

DETAILED DESCRIPTION OF THE DISCLOSURE

Figure 4:
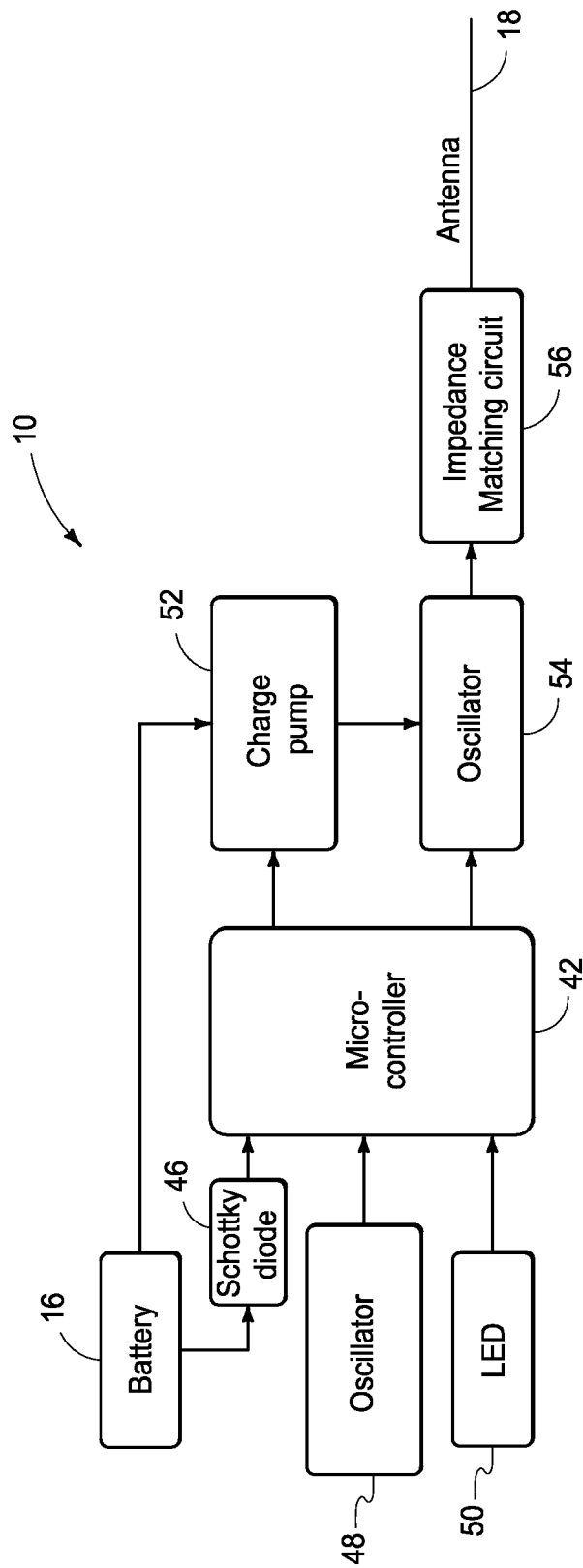
FIG. 4 is a functional block diagram of an organism monitoring device according to one embodiment.

This disclosure is submitted in furtherance of the constitutional purposes of the U.S. Patent Laws "to promote the progress of science and useful arts" (Article 1, Section 8).

A plurality of embodiments of organism monitoring devices are disclosed herein. A first embodiment of an organism monitoring device is discussed in detail below with respect to FIGS. 1-13, and a second embodiment of an organism monitoring device is discussed in detail below with respect to FIGS. 14-24.

The organism monitoring devices of the first embodiment have increased detection range with respect to receiving devices along with having reasonable size and weight. This embodiment is suitable for studying the potential landscape scale attraction of bats to wind turbines, as well as their fine-scale movements across one or more wind farms. It is also useful for tracking other wildlife, such as birds and aquatic species such as fish.

The second embodiment of organism monitoring device has reduced size and weight compared to devices of the first embodiment. These devices may be used in some examples to study the endangered species of Myotis bats that are small in size (current commercially available transmitters are too large in size and weight for use in studying Myotis bats).

Referring to FIGS. 1-3, details of a first embodiment of an organism monitoring device 10 are shown. The organism monitoring device 10 is physically associated with an organism to be monitored, such as a bat, bird or fish. The illustrated example organism monitoring device 10 includes a housing 12 about a plurality a plurality of internal components including a circuit board 14 and a battery 16. Housing 12 is an encapsulating epoxy in one embodiment.

An antenna 18 is coupled with the circuit board 14 and is configured to emit wireless signals, such as radio frequency signals, externally of the organism monitoring device 10 and into the environment about the organism being monitored. In one embodiment, antenna 18 is implemented as part number GWX-0065 and a length of 12 inches.

The housing 12 of the illustrated example organism monitoring device 10 has a width of approximately 5.0 mm, a length of approximately 17.4 mm and a volume of approximately 386 mm$^3$. In addition, the organism monitoring device 10 has a weight of approximately 580-600 mg.

As shown in FIG. 3, one surface 13 of the housing 12 may be flat to provide increased contact area and a suitable adhesive 15 may be used to physically attach the flat surface 13 of organism monitoring device 10 to the body of the organism being monitored. Example adhesives that may be used include Skin Tac, Vet Bond, and Perma-Type Surgical Cement. The organism monitoring devices described herein may be physically associated with organisms to be monitored in other ways in other embodiments.

For applications where the devices 10 are used to monitor bats, hair of the bat to be monitored is trimmed from between the shoulder blades using a pair of curved-edge cosmetic scissors. Finishing Touch Personal Hair Remover may be used to trim the remaining hair in the area as short as possible. The adhesive 15 is applied to both the trimmed area of the bat and flat surface 13 of device 10, and thereafter the surface 13 of device 10 is attached to the trimmed area of the bat after the adhesive has become tacky and held until the adhesive 15 sets.

The device 10 may be activated prior to being associated with the organism and the activated attached device 10 emits wireless signals as the organism moves throughout the environment. The emitted wireless signals may be received via remote receivers (not shown) and the received signals may be used to monitor locations of the organism, for example, by indicating the presence of the organism in the vicinity of the receiver. The signals may be uniquely coded in some embodiments to permit monitoring of individual ones of a plurality of organisms.

Referring to FIG. 4, a functional block diagram of circuitry of organism monitoring device 10 is shown according to the first embodiment. The illustrated device 10 includes processing circuitry in the form of a microcontroller 42, battery 16, a Schottky Diode 46, an oscillator 48, a configuration LED 50, a charge pump regulator 52, an oscillator 54, an impedance matching circuitry 56, and antenna 18. The microcontroller 42, oscillator 48, charge pump regulator 52 and oscillator 54 may be referred to herein as signal generation circuitry. Additional details regarding operations of some of the circuit components of FIG. 4 are discussed in U.S. Pat. No. 10,236,920, the teachings of which are incorporated by reference herein.

In one embodiment, the microcontroller 42 is implemented as a Silicon Labs Sleepy Bee microcontroller. The microcontroller 42 executes embedded firmware that defines and controls the operation of the organism monitoring device 10 and has dimension of approximately 1.66 mm×1.78 mm.

The battery 16 may be a standard-sized battery having part number MB47149, an associated weight of 380 mg and an open-circuit voltage greater than 3.2 V. Other batteries may be used including batteries having smaller volumes and/or reduced weights to further reduce the size and weight of the organism monitoring device 10.

Schottky Diode 46 blocks reverse current that may damage battery 16.

Oscillator 48 is configured to generate and output a fixed 32.768 kHz clock signal for controlling the operation of microcontroller 42 and the generation of wireless signals by device 10.

The configuration LED 50 receives configuration information and operating parameters (start of RF transmission, transmission period, etc.) from an external computer (not shown) and optical link thereto.

Charge pump regulator 52 increases the voltage of electrical energy received from battery 16 and outputs the electrical energy having the increased voltage to the oscillator 54. In one embodiment, regulator 52 outputs a fixed voltage of 3.3 V to power the oscillator 54 and boost the signal strength of the emitted wireless signals compared with using lower voltage electrical energy from the battery 16.

The microcontroller 42 controls selective powering on of the charge pump regulator 52 and programmable oscillator 54 when appropriate to generate and transmit the wireless signals and controls selective powering-off of these components between transmissions to conserve the life of the battery 16 and device 10.

In one embodiment, oscillator 54 is implemented as a programmable oscillator 54 that is programmed to generate a symmetrical square wave signal. The Fourier series of a square wave is $$\text{square}(t) = \frac{4}{\pi}\sum_{n=1}^{\infty}\frac{\sin(nt)}{n} = \left(\frac{4}{\pi}\right)\left(\frac{\sin(t)}{1} + \frac{\sin(3t)}{3} + \frac{\sin(5t)}{5} + \cdots\right)$$

A square wave only contains odd harmonics and the amplitude decreases in inverse portion to harmonic order n. The programmable oscillator 54 can be programed to different harmonics in different embodiments including a 1st harmonic, 3rd harmonic, 5th harmonic, et al., to generate a sine wave signal. In one embodiment, wireless signals outputted from the device 10 are within the frequency range allocated by the FCC of 164-168 MHz and wireless signals of other frequencies may be generated in other embodiments.

In the presently-described embodiment of FIGS. 1-13, the oscillator 54 is powered at 3.3 V from charge pump regulator 52 and programmed directly to 164-168 MHz to generate a sine wave at 164~168 MHz using the 1st harmonic (fundamental frequency). The use of an increased voltage (e.g., 3.3 V) to power the oscillator 54 compared to the second embodiment described below and use of the fundamental frequency of the oscillator 54 increases the voltage on transmitting antenna 18 approximately 9.17 times compared to the second embodiment of the organism monitoring device 10 described below. This results in increased signal strength of wireless communications from device of the presently-described embodiment and increased range compared with the second embodiment described below.

The impedance matching circuitry 56 is configured to increase the signal strength of wireless communications from the organism monitoring device 10 despite circuit boards of the disclosed embodiments of device 10 having small ground panel areas (e.g., less than 10 mm$^2$ in the second embodiment described below) that would otherwise result in lower signal strength. The use of impedance matching circuitry 56 improves the signal strength without significantly increasing the size and weight of the device 10.

Impedance matching circuitry 56 is configured to match the impedance of the output of the oscillator 54 of the signal generation circuitry with the impedance of the input of antenna 18 to increase the power transfer and reduce the signal reflection in accordance with the maximum power transfer theorem and in comparison with embodiments of the device that do not include circuit 56. In more specific embodiments, circuit 56 is configured to maximize the power transfer and minimize the signal reflection.

One example method that may be used to determine a characteristic impedance of the organism monitoring device 10 is discussed hereafter including use of the maximum power transfer theorem and a trim pot (variable resistor) to estimate the impedance of the output of oscillator 54. In this implementation, the output voltage of oscillator 54 is measured at the desired operating frequency at completely open circuit without antenna 18 being connected. Thereafter, the output of oscillator 54 is connected to the trim pot and the resistance of the trim pot is reduced until the amplitude of the output of the oscillator 54 is half what it was in open circuit and the value of the corresponding impedance is recorded (e.g., 200 Ohms at 165 MHz in one measurement).

Thereafter, a RF software High Frequency Structure Simulator (HSSS) may use the recorded impedance value, an electrical model of antenna 18, and the respective frequency range of the wireless signals (e.g., 164~168 MHz) to determine a match circuit solution for the impedance matching circuitry 56.

Figure 5:
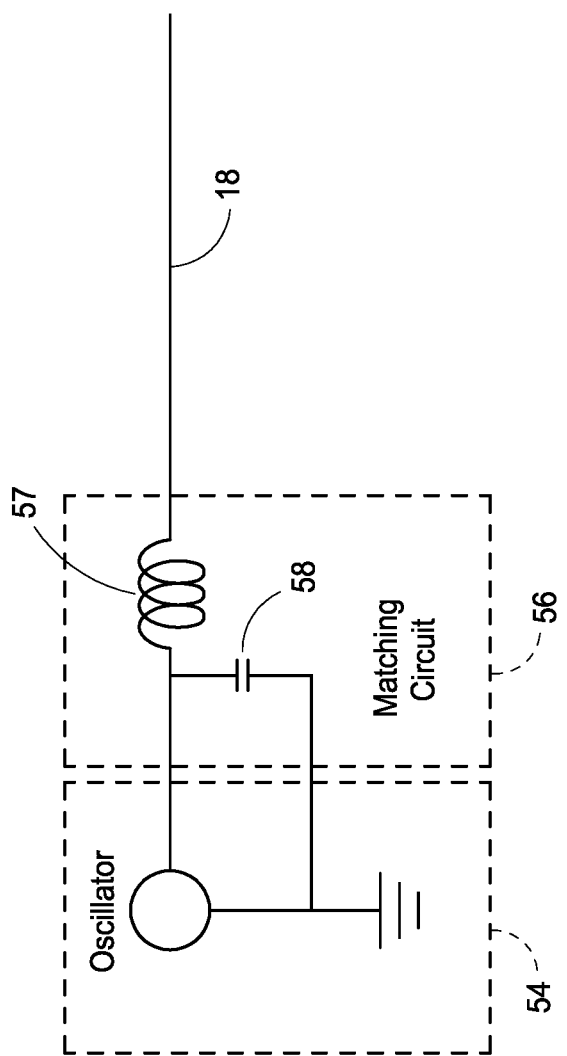
FIG. 5 is a circuit schematic diagram of components of an organism monitoring device according to one embodiment.

Referring to FIG. 5, an example implementation of impedance matching circuitry 56 is shown coupled between oscillator 54 and antenna 18. The impedance matching circuitry 56 includes an inductor 57 coupled in series between an output of the oscillator 54 and an input of antenna 18 and a capacitor 58 connected from the output of the oscillator 54 to ground in the illustrated embodiment. Other configurations of circuit 56 may be used in other implementations, for example omitting one of the inductor or capacitor or using inductors and capacitors of different values.

Figure 6:
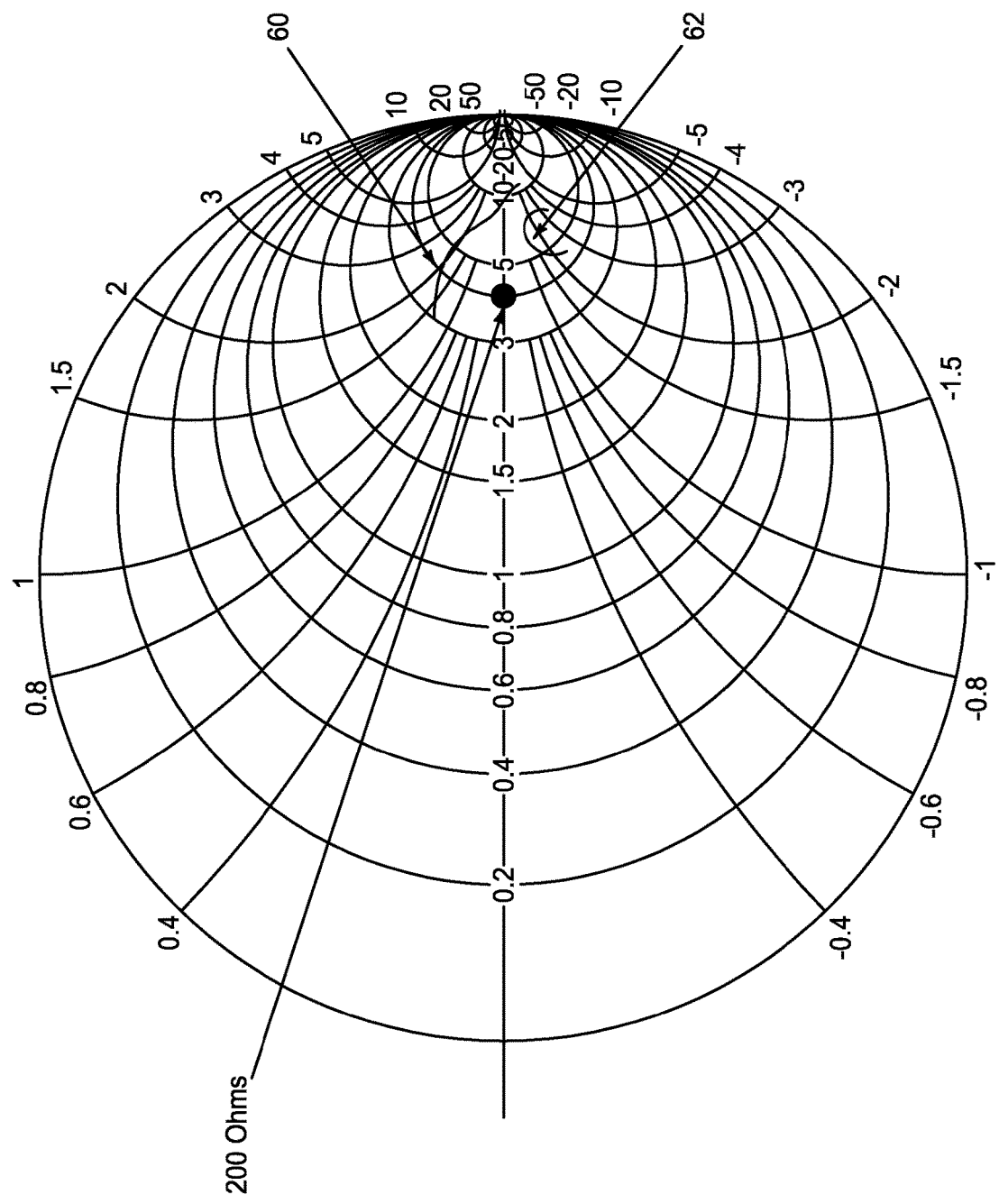
FIG. 6 is a graphical representation of results of an impedance matching simulation.

Referring to FIG. 6, example simulation results of impedance matching are illustrated. It is desired for the impedance to stay near the real axis for most antenna positions. Simulation results of two example impedance matching circuits 56 that may be used in organism monitoring device 10 are shown in FIG. 6 including results 60 of a first impedance matching circuit including inductor 57 having a value of 650 nH with no capacitor, and results 62 of a second impedance matching circuit including inductor 57 having a value of 751 nH and shunt capacitor 58 having a value of 3.0 pF. The above example first impedance matching circuit has reduced bandwidth compared with the second impedance matching circuit. However, the use of the second embodiment of the impedance matching circuitry 56 discussed above resulted in an increase in signal strength of the wireless communications of 12-14 dB of the first embodiment of device 10 compared to arrangements where the circuit 56 was omitted from the device.

A plurality of circuits of the first embodiment of the organism monitoring device 10 are shown in FIGS. 7-11.

Figure 7:
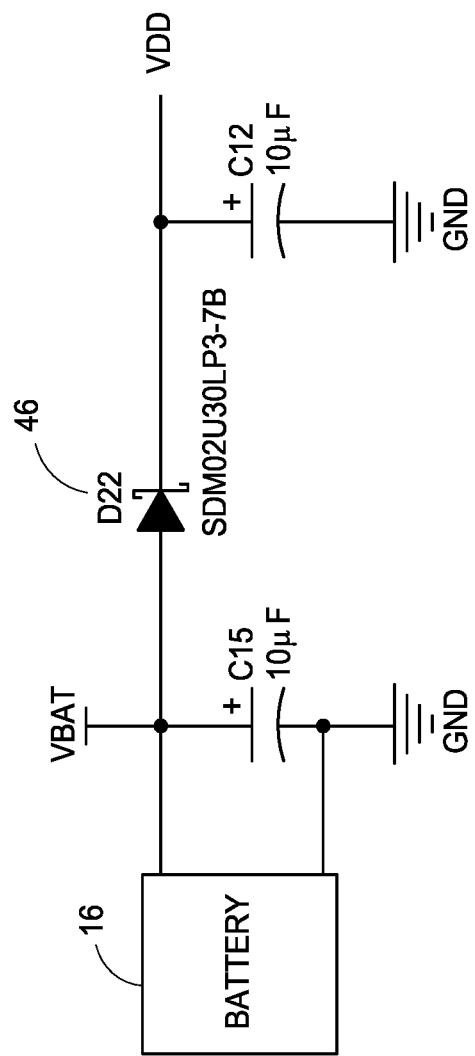
FIG. 7 is a circuit schematic diagram of circuitry for supplying power to circuit components of the organism monitoring device according to one embodiment.

Referring to FIG. 7, an example of power supply circuitry of one embodiment of the organism monitoring device 10 is shown. The two 10 µF Tantalum capacitors C12 and C15 lower the voltage drop across the battery 16 from 500 mV to 300 mV.

Figure 8:
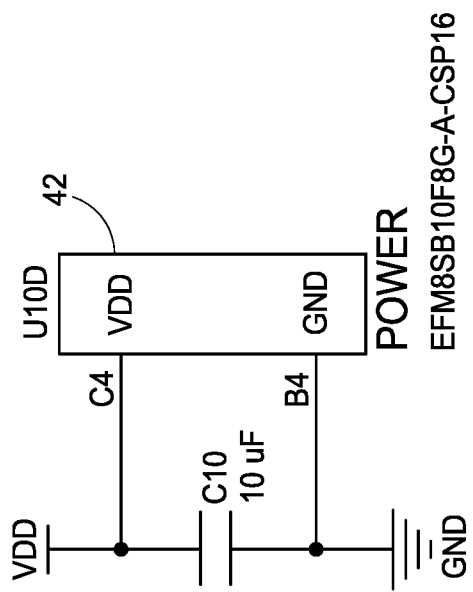
FIG. 8 is a circuit schematic diagram of circuitry for supplying power to a microcontroller of the organism monitoring device according to one embodiment.

Referring to FIG. 8, an example circuit for supplying power to microcontroller 42 is shown.

Figure 9:
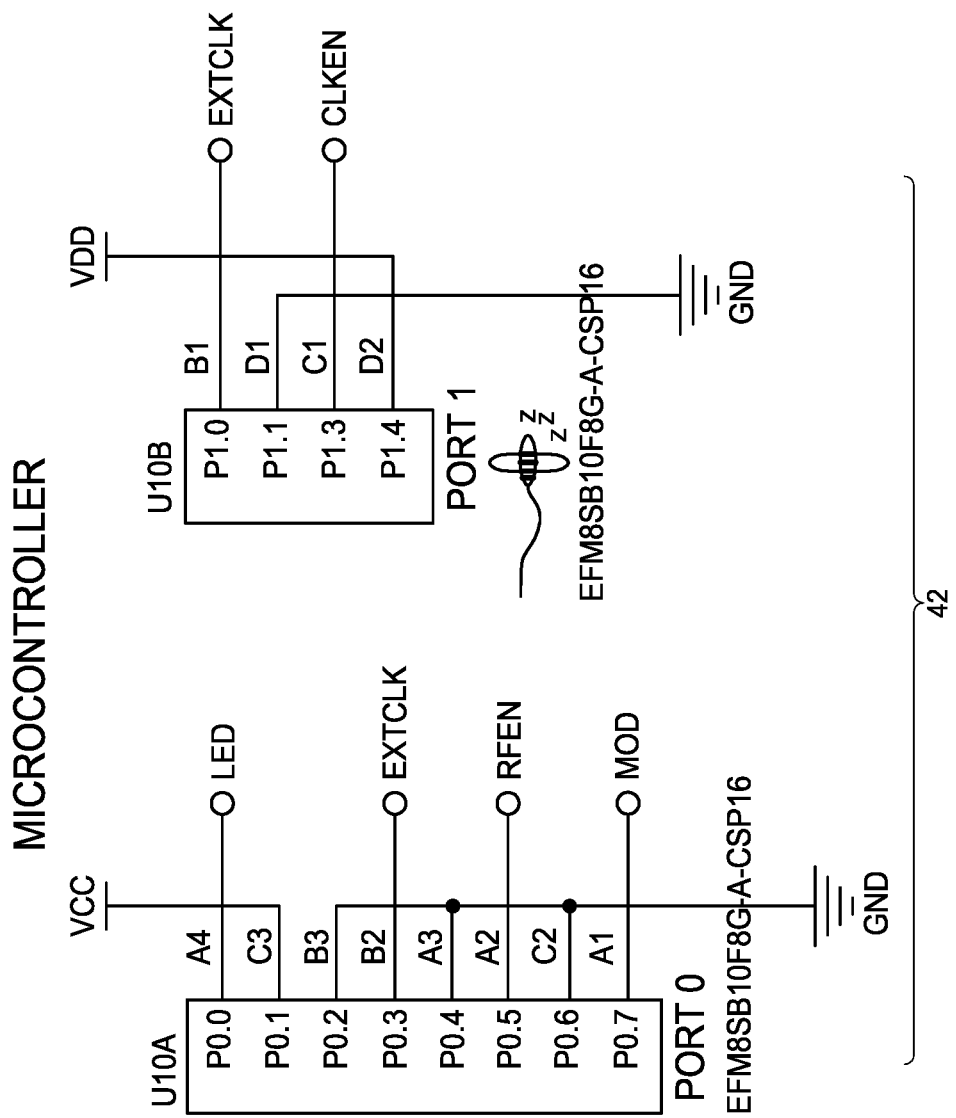
FIG. 9 is a circuit schematic diagram of ports of a microcontroller of the organism monitoring device according to one embodiment.

Referring to FIG. 9, ports 0 and 1 of microcontroller 42 and connections thereof to external circuitry are shown according to one embodiment.

Figure 10:
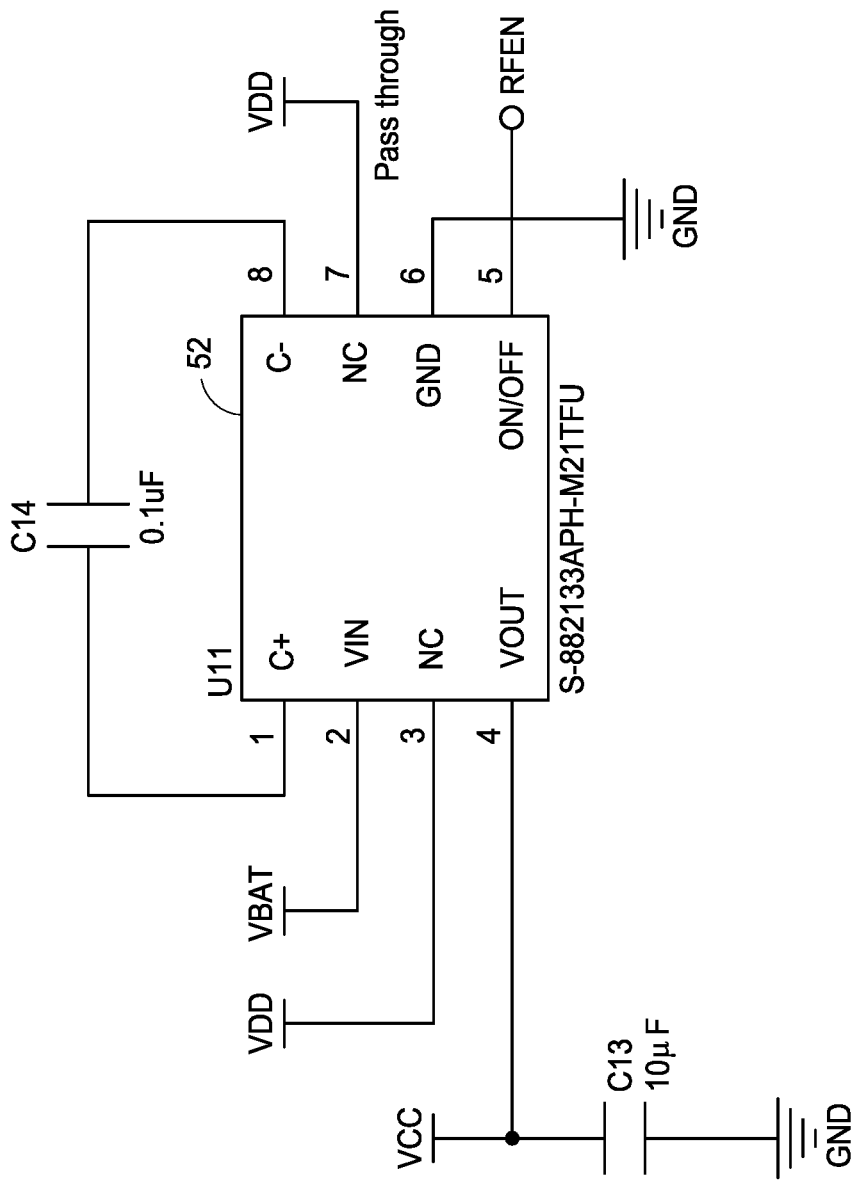
FIG. 10 is a circuit schematic diagram of a charge pump regulator of the organism monitoring device according to one embodiment.

Referring to FIG. 10, an example circuit including the charge pump regulator 52 is shown.

Figure 11:
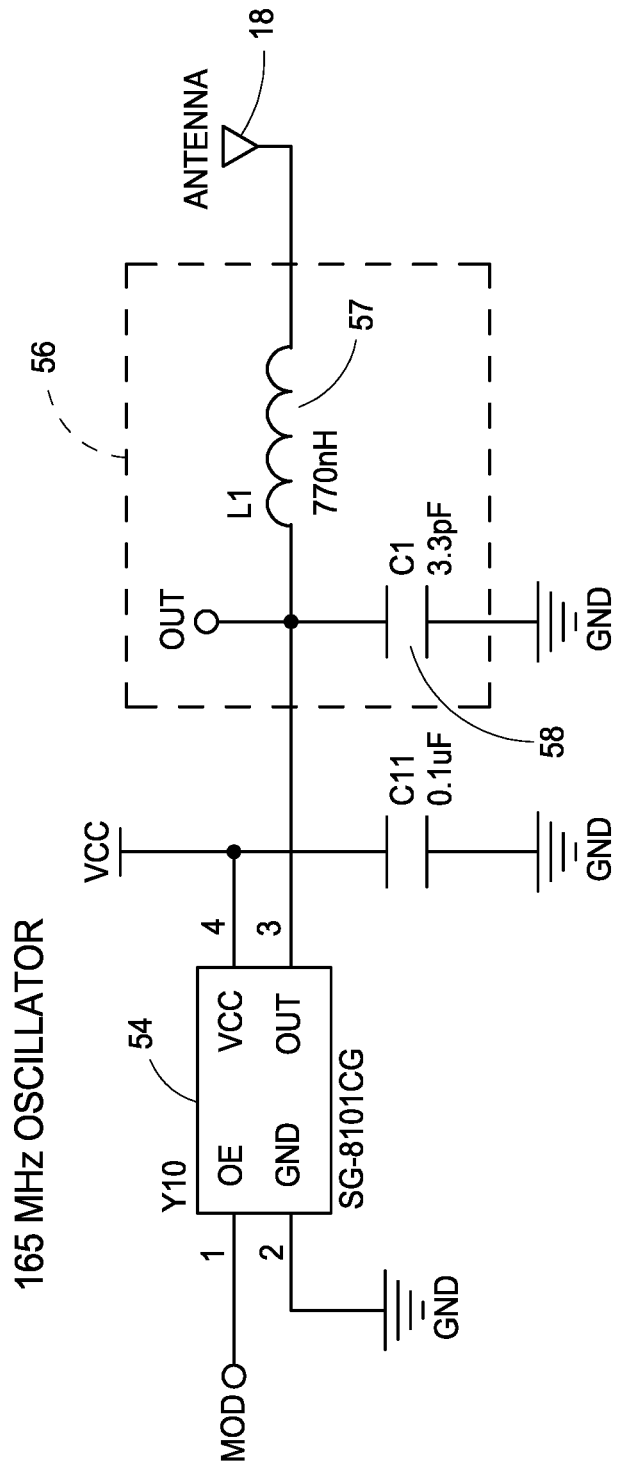
FIG. 11 is a circuit schematic diagram of a programmable oscillator and impedance matching circuitry of the organism monitoring device according to one embodiment.

Referring to FIG. 11, an example circuit including the programmable oscillator 54 and impedance matching circuitry 56 is shown. In this example circuit, impedance matching circuitry 56 includes a 770 nH inductor 57 (e.g., part number 0402DF-771XJRU and having dimensions of 1.11 mm×0.66 mm×0.66 mm) and a 3.3 pF shunt capacitor 58 (e.g., part number CBRO2C339B3GAC and having dimensions of 0.63 mm×0.3 mm×0.3 mm). Pin 3 of oscillator 54 may be referred to as an output node of the signal generation circuitry.

Figure 12:
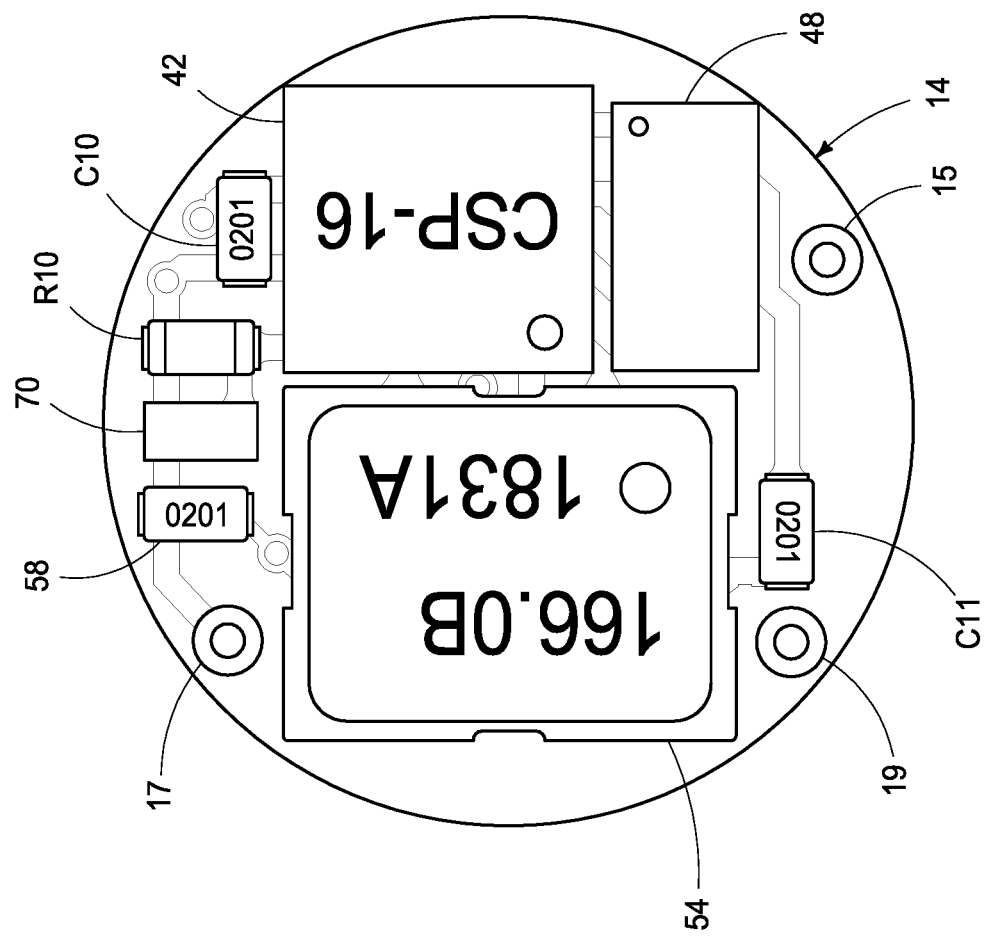
FIG. 12 is an illustrative representation of a first side of a circuit board of the organism monitoring device according to one embodiment.
Figure 13:
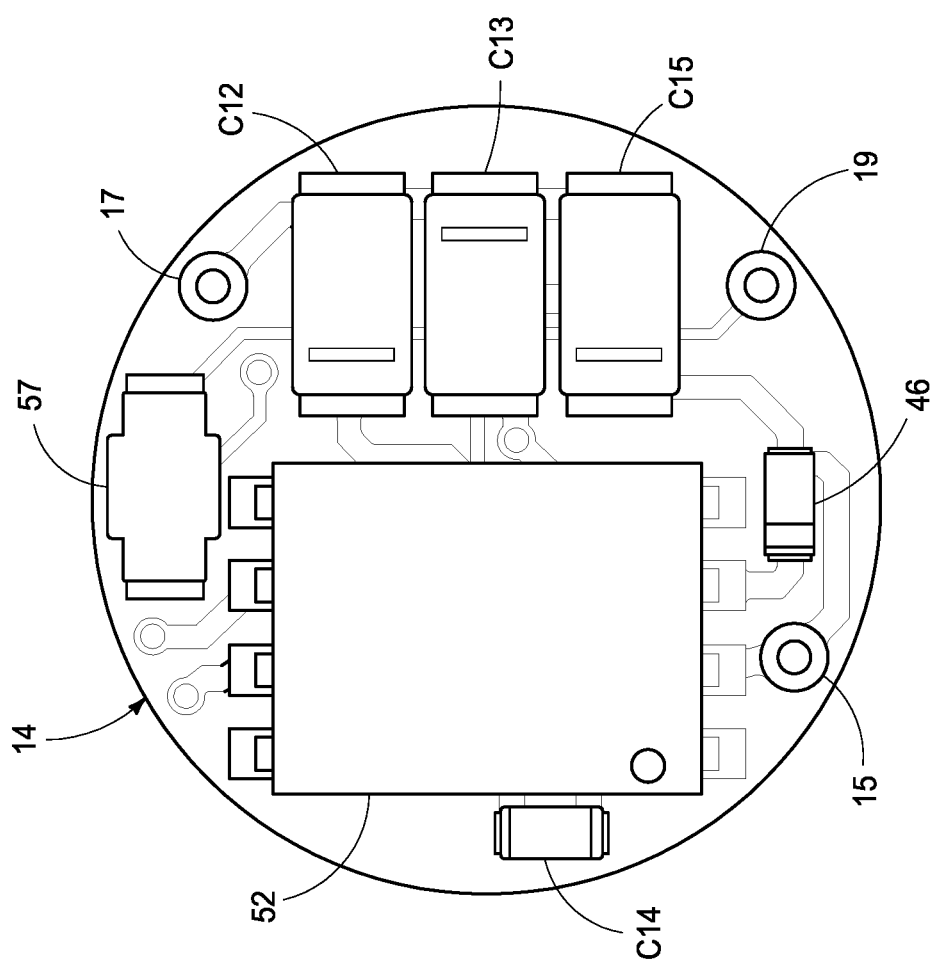
FIG. 13 is an illustrative representation of a second side of the circuit board that is opposite to the first side of the circuit board of FIG. 12.

An example circuit layout on circuit board 14 is shown in FIGS. 12-13 that includes circuitry of FIGS. 7-11 upon opposite sides of the circuit board 14 as described below.

The side of circuit board 14 shown in FIG. 12 includes a positive battery connection 15, a negative battery connection 17, an antenna connection 19, microcontroller 42, oscillator 48, oscillator 54, capacitor 58, capacitors C10, C11, LED 50 and a resistor R10 which is implemented as a 1.0 MOhm resistor in parallel with LED 50. The illustrated circuit board 14 has a diameter of approximately 4.7 mm and a thickness of 2.0 mm.

The side of circuit board 14 shown in FIG. 13 includes positive battery connection 15, negative battery connection 17, antenna connection 19, charge pump regulator 52, inductor 57, Schottky diode 46, and capacitors C12-C15.

A second embodiment of the organism monitoring device 10*a* is shown in FIGS. 14-24 and described below.

Figure 14:
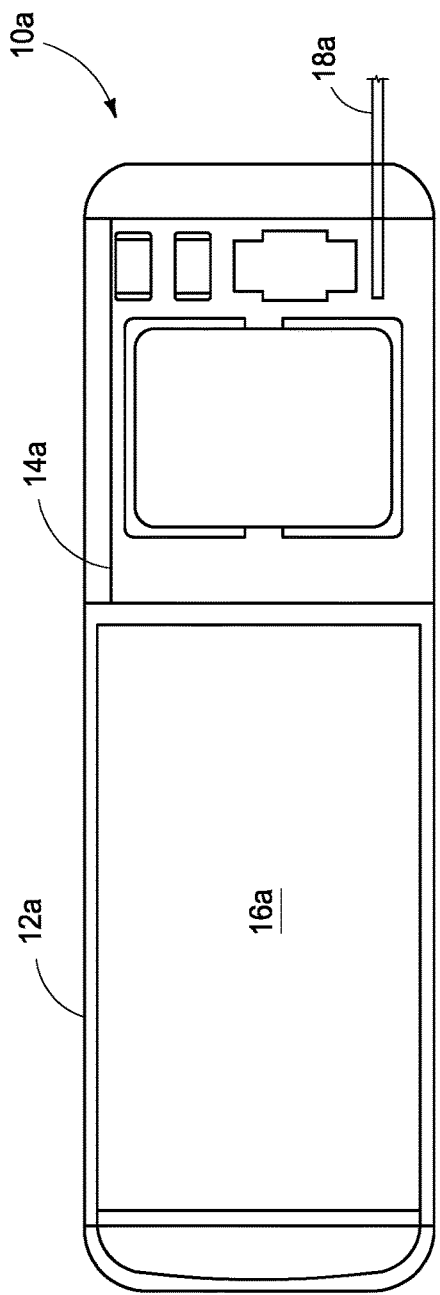
FIG. 14 is a top view of an organism monitoring device according to another embodiment.
Figure 15:
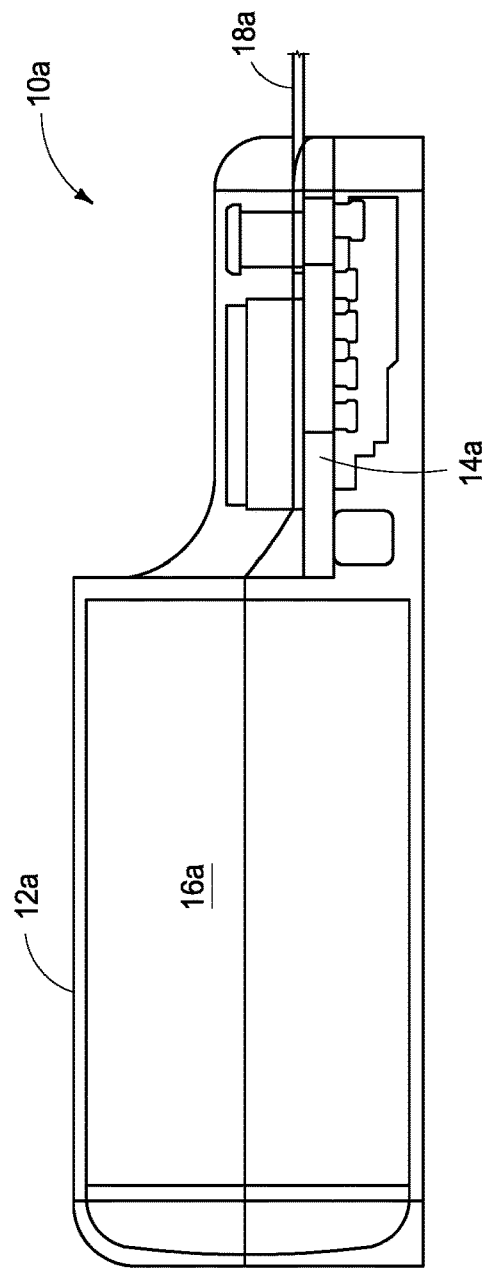
FIG. 15 is a bottom view of an organism monitoring device according to another embodiment.
Figure 16:
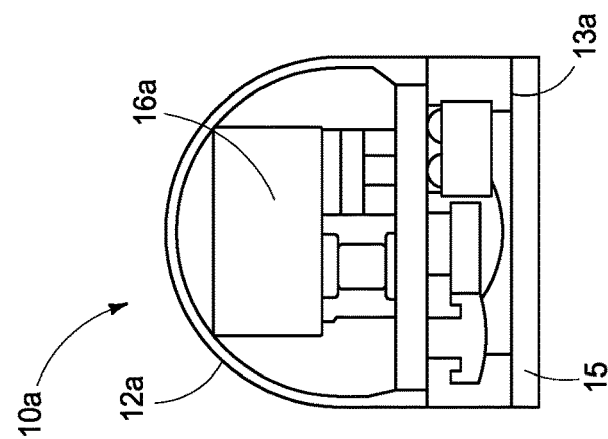
FIG. 16 is a side view of an organism monitoring device according to another embodiment.

Referring to FIGS. 14-16, similar to the first embodiment of device 10 described above, the organism monitoring device 10*a* of the second embodiment is physically associated with an organism to be monitored, such as a bat, bird or aquatic species such as fish. The illustrated example organism monitoring device 10 includes a housing 12*a*, such as an encapsulating epoxy about a circuit board 14*a* and a battery 16*a*.

The illustrated device 10*a* has a length of approximately 10.35 mm, a width of 3.2 mm, a volume of approximately 80.5 mm$^3$, an approximate weight of 0.1636 g that is 25% lighter than the smallest conventional RF transmitters.

Circuit board 14*a* is approximately 2.79 mm×3.51 mm in the described embodiment.

An antenna 18*a* is coupled with the circuit board 14*a* and is configured to emit wireless signals externally of the organism monitoring device 10 and into the environment of the organism.

As shown in FIG. 16, a suitable adhesive 15 may be used to attach the flat surface 13 of organism monitoring device 10 to the body of the organism being monitored. The attached device 10 is activated and the activated device emits wireless signals as the organism moves throughout the environment and the wireless signal may be used to monitor locations of the organism and perhaps the identity of individual organisms as mentioned above with respect to the first embodiment of device 10.

Figure 17:
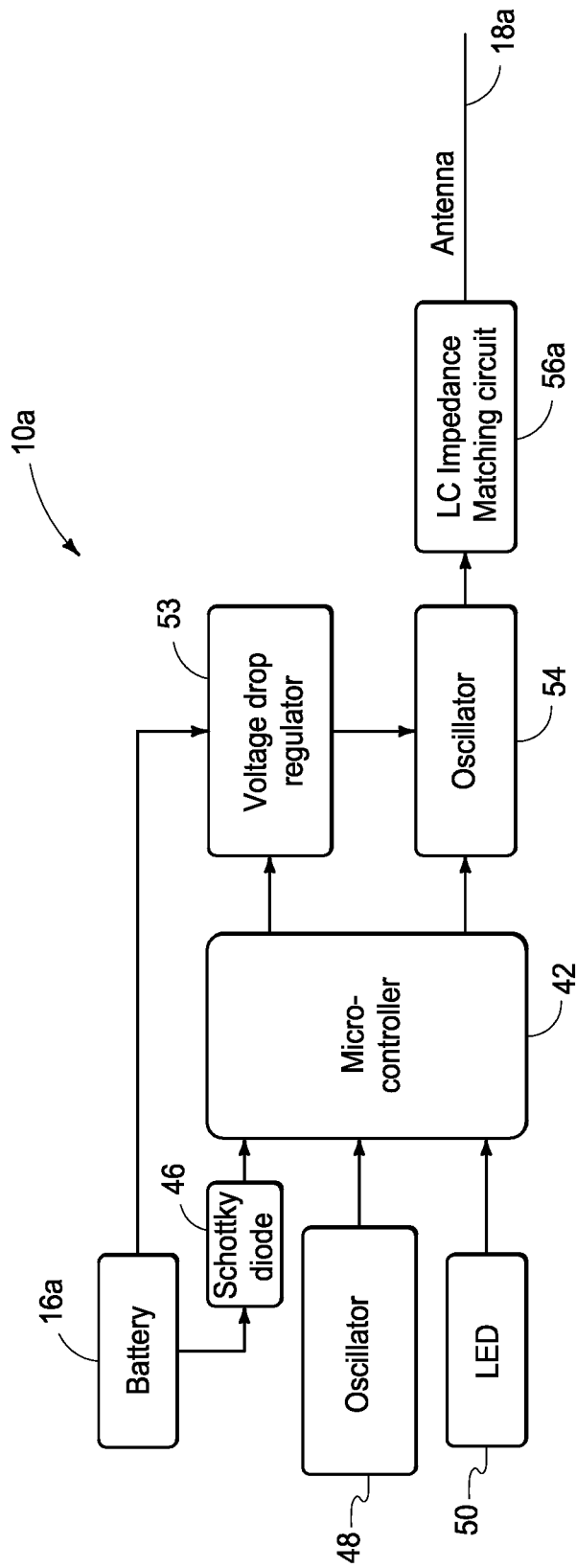
FIG. 17 is a functional block diagram of an organism monitoring device according to another embodiment.

Referring to FIG. 17, a functional block diagram of example circuitry of organism monitoring device 10a of the second embodiment is shown. The illustrated device 10a includes processing circuitry in the form of microcontroller 42, battery 16a, Schottky diode 46, oscillator 48, configuration LED 50, a low-dropout (LDO) voltage regulator 53, oscillator 54, an impedance matching circuitry 56, and antenna 18a. The microcontroller 42, oscillator 48, voltage regulator 53 and oscillator 54 may again be referred to herein as signal generation circuitry and Schottky diode 46, oscillator 48, configuration LED 50, oscillator 54, and impedance matching circuitry 56 may be implemented similar to the respective components described above with respect to the first embodiment of the devices.

The battery 16a may be a standard-sized telemetry battery having part number MB3060, a weight of 72.6 mg and an open-circuit voltage greater than 3.2 V. Other batteries may be used including batteries of smaller volume and/or reduced weight to further reduce the size and weight of the organism monitoring device 10.

The voltage drop regulator 53 outputs a fixed voltage of 1.8 V to power the oscillator 54 at a reduced voltage compared with the first embodiment to reduce energy consumption and increase service life of the second embodiment of the device 10a compared with the first embodiment of the device 10.

The programmable oscillator 54 is programed to 54.667-56 MHz to generate a sine wave at 164-168 MHz using the 3rd harmonic in one embodiment. The microcontroller 42 controls the selective powering on of the regulator 53 and programmable oscillator 54 for transmission of the wireless signals and powering-off of these components between transmissions to conserve the battery 16.

A plurality of circuits of the first embodiment of the organism monitoring device 10 are shown in FIGS. 18-22.

Figure 18:
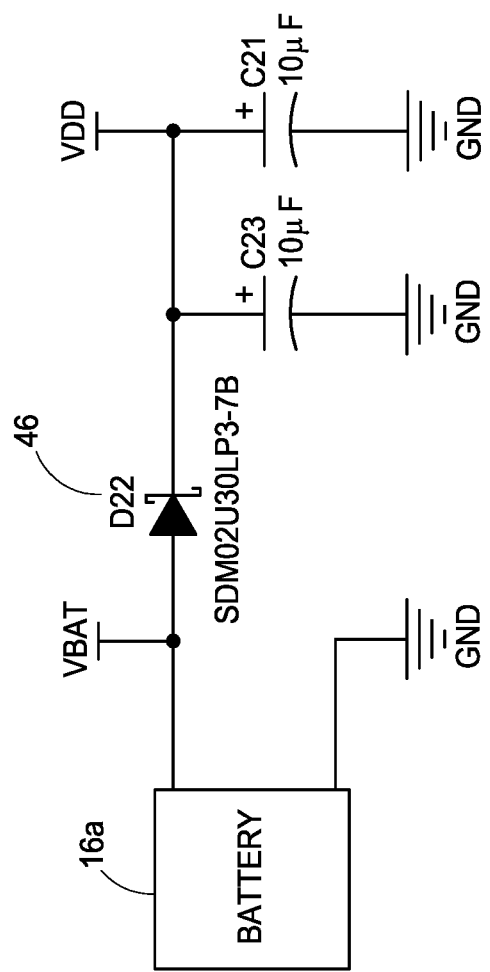
FIG. 18 is a circuit schematic diagram of circuitry for supplying power to circuit components of the organism monitoring device according to another embodiment.

Referring to FIG. 18, an example of power supply circuitry of one embodiment of the organism monitoring device 10a is shown.

Figure 19:
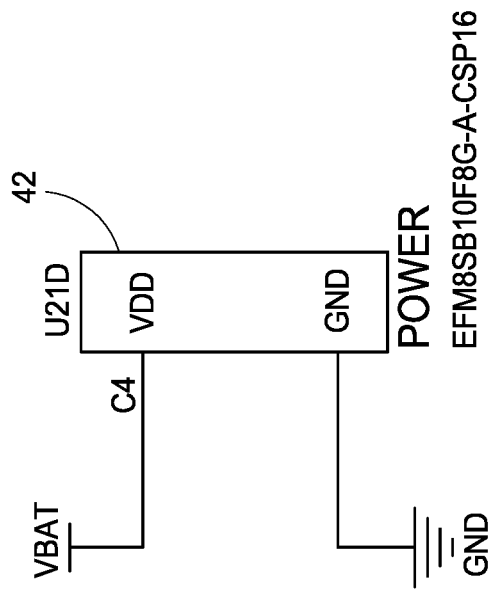
FIG. 19 is a circuit schematic diagram of circuitry for supplying power to a microcontroller of the organism monitoring device according to another embodiment.

Referring to FIG. 19, an example circuit for supplying power to microcontroller 42 is shown.

Figure 20:
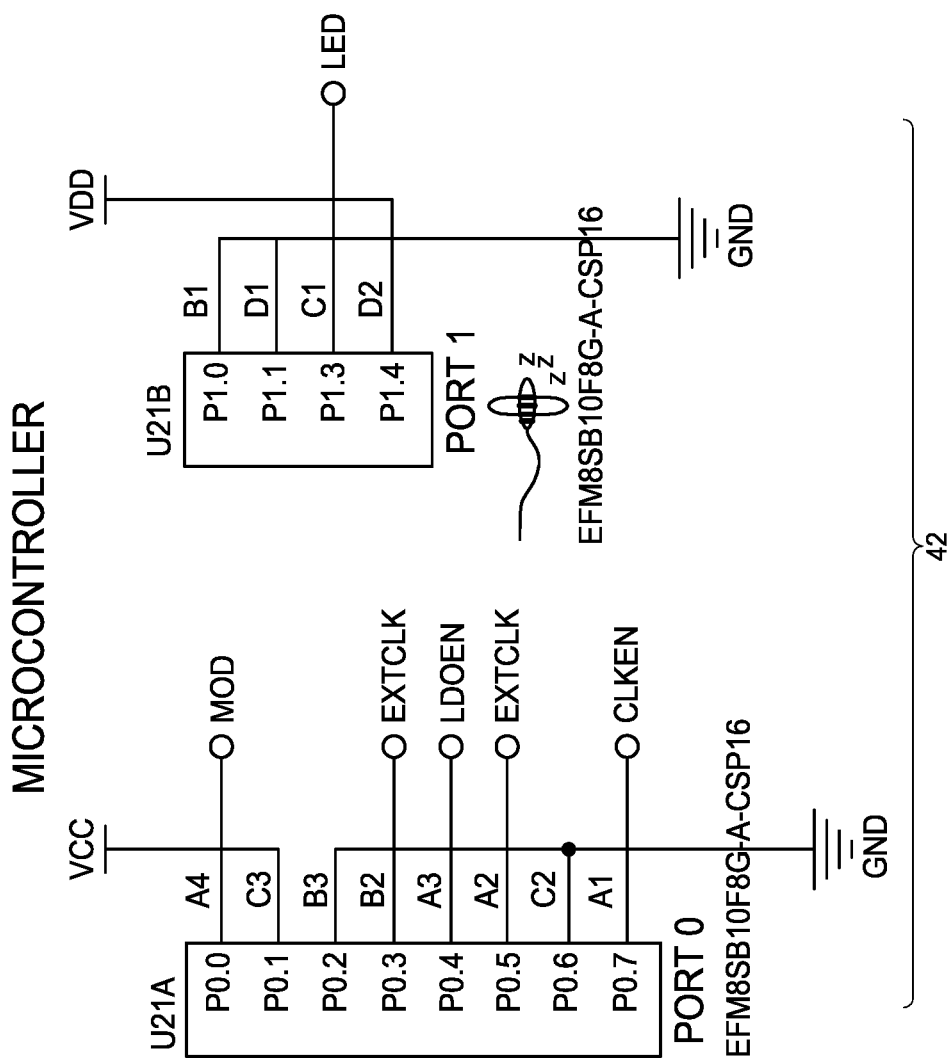
FIG. 20 is a circuit schematic diagram of ports of a microcontroller of the organism monitoring device according to another embodiment.

Referring to FIG. 20, ports 0 and 1 of microcontroller 42 and connections thereof are shown according to one embodiment.

Figure 21:
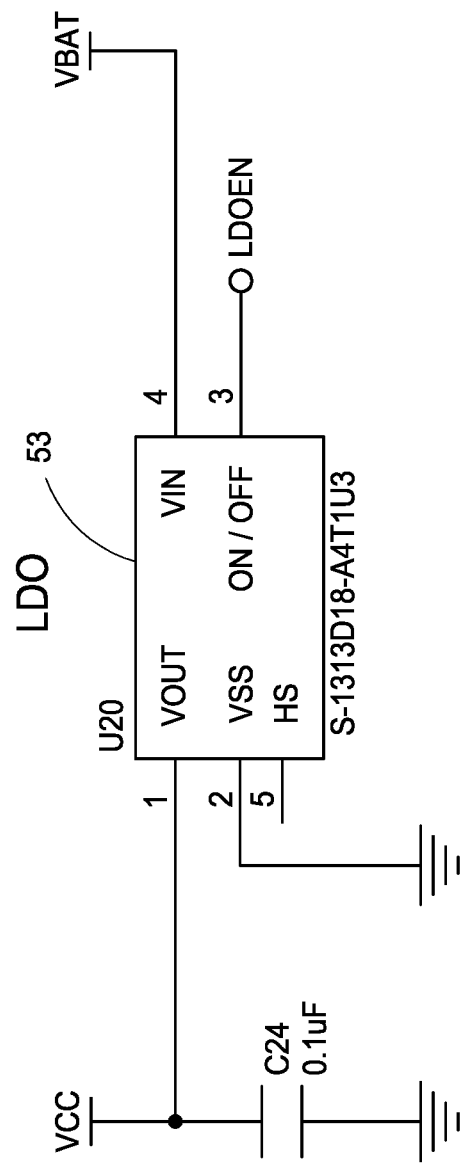
FIG. 21 is a circuit schematic diagram of a low-dropout voltage regulator of the organism monitoring device according to another embodiment.

Referring to FIG. 21, an example circuit including the voltage drop regulator 53 is shown.

Figure 22:
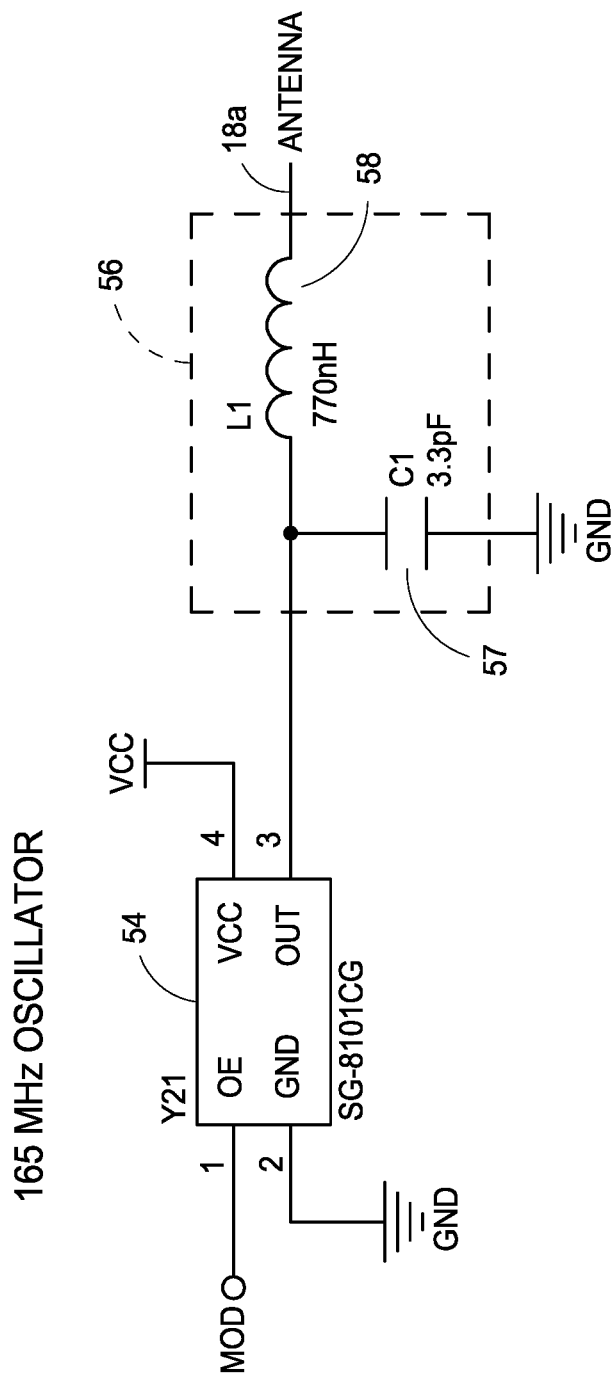
FIG. 22 is a circuit schematic diagram of a programmable oscillator and impedance matching circuitry of the organism monitoring device according to another embodiment.

Referring to FIG. 22, an example circuit including the programmable oscillator 54 and impedance matching circuitry 56 are shown. Pin 3 of oscillator 54 may be referred to as an output node of the signal generation circuitry.

Figure 23:
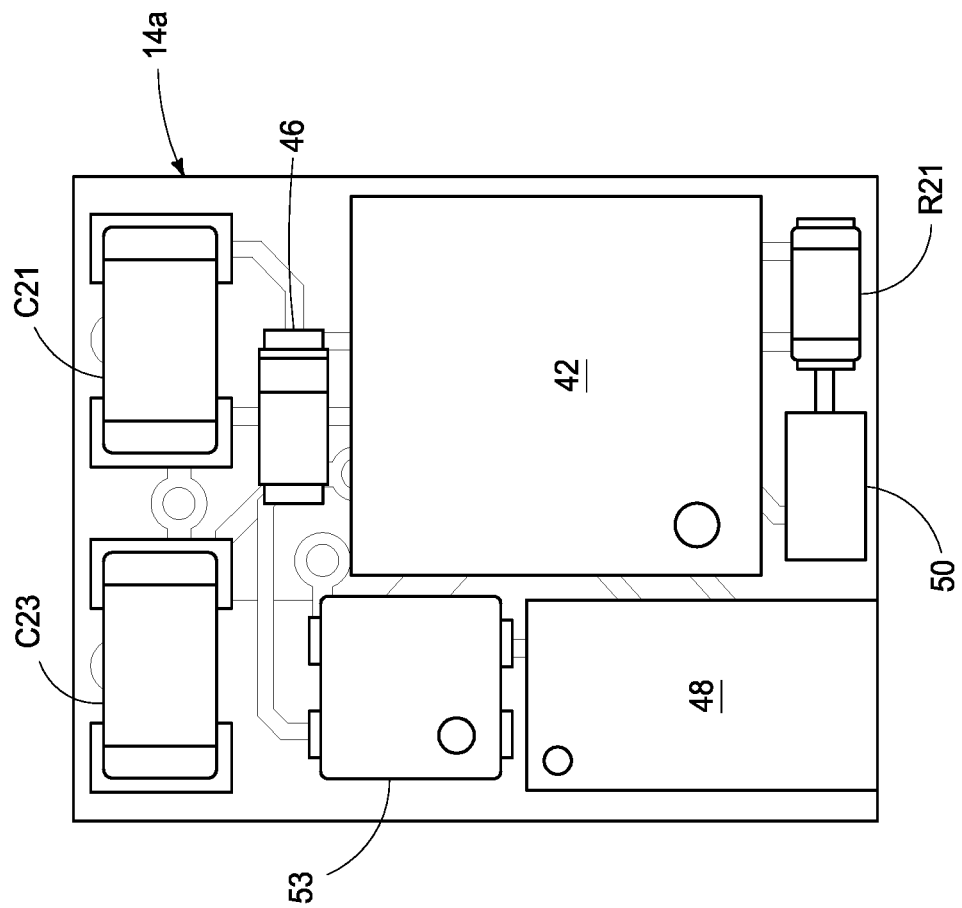
FIG. 23 is an illustrative representation of a first side of a circuit board of the organism monitoring device according to another embodiment.
Figure 24:
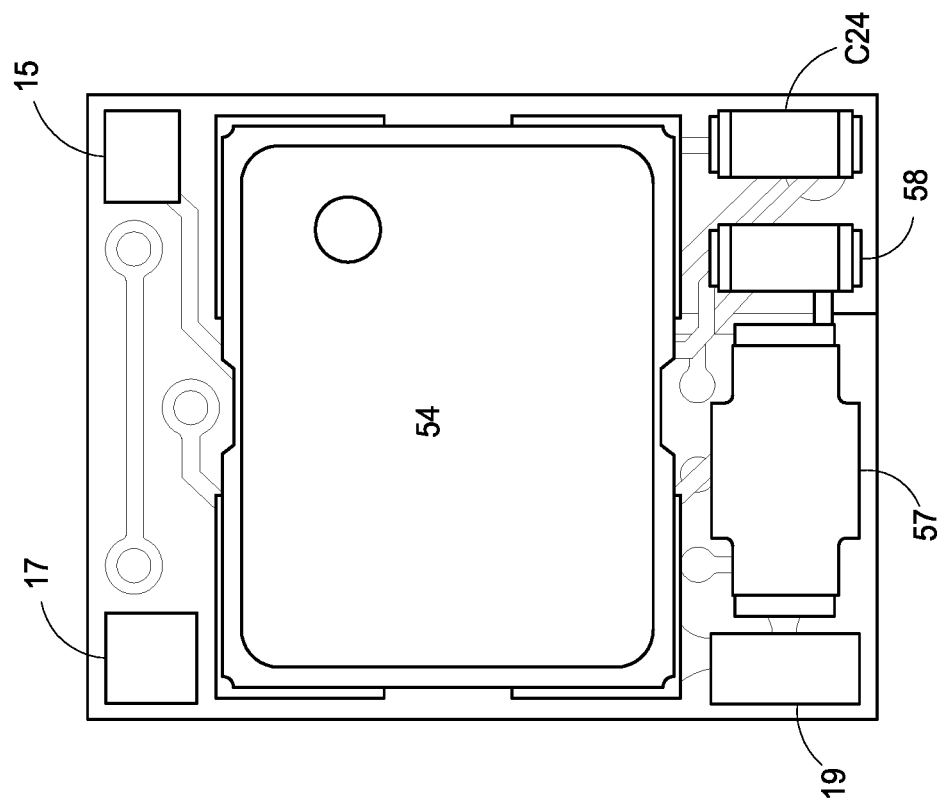
FIG. 24 is an illustrative representation of a second side of the circuit board that is opposite to the first side of the circuit board of FIG. 23.

An example circuit layout of circuit board 14a is shown in FIGS. 23-24 that includes circuitry of FIGS. 18-22 upon opposite sides of the circuit board 14.

The side of circuit board 14a shown in FIG. 23 includes microcontroller 42, oscillator 48, capacitors C21, C23, voltage drop regulator 53, Schottky diode 46 and a resistor R21.

The side of circuit board 14 shown in FIG. 24 includes positive battery connection 15, negative battery connection 17, antenna connection 19, oscillator 54, inductor 57, capacitor 58, and a capacitor C24.

The organism monitoring devices described above may communicate wireless signals that are coded or uncoded depending upon the application.

For uncoded applications, the organism monitoring devices transmit periodic bursts of a continuous RF wireless signal, for example a 20 ms continuous signal although the length of the signal is programmable. Example periods of transmission are 1-20 seconds. In some embodiments, the devices are individually programmed to communicate a wireless signal having a unique one of a plurality of different frequencies to permit unique identification of tagged organisms associated with the devices.

Referring to FIG. 25, an example coding scheme using a plurality differently coded wireless signals is described to enable a plurality of organisms to be uniquely identified with the same frequency of the wireless signals. Three example code schemes 80, 82, 84 are shown in FIG. 25 that may be used to uniquely identify three organism monitoring devices and associated organisms.

The depicted individual code schemes use three or more pulses with time progressing to the right, including a relatively wide pulse at the beginning to indicate the start of a sequence followed by a series of narrower pulses. The distance between pulses is varied to produce different codes. The sequence of t1, t2, and t3 is the ID code or code burst, and the time between the pulse sequences (t4) is the code period. The time between pulses (t1, t2, and t3) and the time between pulse groups (t4) are used to distinguish the individual code and organism. Other coding schemes may be used in other embodiments.

The RF signal strength of three prototypes of each of the first and second embodiments of the organism monitoring devices were tested and compared using an Agilent MXA N9020A Signal Analyzer in the laboratory. The frequencies of the wireless signals of the prototypes were programmed to be at different values. Table A shows the weights and signal strengths of the devices at 1 meter distance from the signal analyzer for the different frequencies.

TABLE A

| | | | | Average |
|---|---|---|---|---|
| Embodiment 1 | | | | |
| Frequency (MHz) | 164.49 | 164.52 | 164.55 | |
| Weight (mg) | 159.9 | 158.4 | 156.5 | 158.3 |
| Singal Strength (dBm) | −68.276 | −68.892 | −70.034 | −69.067 |
| Embodiment 2 | | | | |
| Frequency (MHz) | 167.13 | 167.15 | 167.03 | |
| Weight (mg) | 589.2 | 588.8 | 596.8 | 591.6 |
| Singal Strength (dBm) | −41.764 | −38.065 | −39.183 | −39.671 |

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended aspects appropriately interpreted in accordance with the doctrine of equivalents.

Further, aspects herein have been presented for guidance in construction and/or operation of illustrative embodiments of the disclosure. Applicant(s) hereof consider these described illustrative embodiments to also include, disclose and describe further inventive aspects in addition to those explicitly disclosed. For example, the additional inventive aspects may include less, more and/or alternative features than those described in the illustrative embodiments. In more specific examples, Applicants consider the disclosure to include, disclose and describe methods which include less, more and/or alternative steps than those methods explicitly disclosed as well as apparatus which includes less, more and/or alternative structure than the explicitly disclosed structure.

What is claimed is:

1. An organism monitoring device comprising:
a housing configured to be physically associated with an organism to be monitored;
an antenna coupled with the housing;
signal generation circuitry coupled with the housing and comprising:
an oscillator configured to generate an oscillation signal; and
an output node configured to output the oscillation signal externally of the signal generation circuitry;
impedance matching circuitry coupled with the housing, the antenna and the signal generation circuitry, and wherein the impedance matching circuitry is configured to match an impedance of the output node of the signal generation circuitry and an impedance of an input of the antenna, and wherein the impedance matching circuitry is further configured to receive the oscillation signal from the output node of the signal generation circuitry and to provide the oscillation signal to the input of the antenna;
wherein the antenna is configured to emit a wireless signal externally of the organism monitoring device as a result of the provision of the oscillation signal to the input of the antenna; and
wherein the impedance matching circuitry comprises an inductor coupled in series between the output node of the signal generation circuitry and the input of the antenna.

2. The monitoring device of claim 1 wherein the housing is physically attached to the organism during the emission of the wireless signal from the antenna.

3. The monitoring device of claim 1 wherein the impedance matching circuitry is configured to increase an amount of power transfer between the signal generation circuitry and the antenna compared with an amount of power transfer in an absence of the impedance matching circuitry.

4. The monitoring device of claim 1 wherein the impedance matching circuitry is configured to maximize power transfer between the signal generation circuitry and the antenna.

5. The monitoring device of claim 1 wherein the signal generation circuitry comprises a microcontroller, and wherein the microcontroller is configured to selectively turn on the oscillator to generate the oscillation signal.

6. An organism monitoring device comprising:
a housing configured to be physically associated with an organism to be monitored;
an antenna coupled with the housing;
signal generation circuitry coupled with the housing and comprising:
an oscillator configured to generate an oscillation signal; and
an output node configured to output the oscillation signal externally of the signal generation circuitry;
impedance matching circuitry coupled with the housing, the antenna and the signal generation circuitry, and wherein the impedance matching circuitry is configured to match an impedance of the output node of the signal generation circuitry and an impedance of an input of the antenna, and wherein the impedance matching circuitry is further configured to receive the oscillation signal from the output node of the signal generation circuitry and to provide the oscillation signal to the input of the antenna;
wherein the antenna is configured to emit a wireless signal externally of the organism monitoring device as a result of the provision of the oscillation signal to the input of the antenna; and
a battery coupled with the housing, and wherein the signal generation circuitry comprises a charge pump regulator that is configured to increase a voltage of electrical energy received from the battery and to output the electrical energy having the increased voltage to the oscillator.

7. The monitoring device of claim 6 wherein the signal generation circuitry comprises a microcontroller, and wherein the microcontroller is configured to selectively turn on the charge pump regulator.

8. The monitoring device of claim 7 wherein the microcontroller is configured to selectively turn on the oscillator to generate the oscillation signal.

9. The monitoring device of claim 1 wherein the impedance matching circuitry comprises a capacitor coupled with the output node and ground.

10. The monitoring device of claim 1 wherein the housing has a volume of 85 mm$^3$ or less.

11. The monitoring device of claim 1 wherein the housing has a weight of 165 mg or less.

12. An organism monitoring method comprising:
generating an oscillation signal using an oscillator;
providing the oscillation signal from an output of the oscillator to an input of an antenna, wherein the providing comprises matching an impedance of the input of the antenna with an impedance of the output of the oscillator;
using the antenna, emitting a wireless signal from and external of an organism as a result of the providing the oscillation signal to the input of the antenna;
wherein the matching comprises matching using impedance matching circuitry; and
wherein the providing comprises providing the oscillation signal directly from the output of the oscillator to the impedance matching circuitry.

13. The method of claim 12 wherein the oscillator is within a housing of an organism monitoring device, and further comprising physically attaching the housing to the organism.

14. The method of claim 12 wherein the matching the impedance increases an amount of power transfer between the output of the oscillator and the input of the antenna compared with an amount of power transfer in an absence of the matching.

15. The method of claim 12 wherein the matching comprises inductively coupling the output of the oscillator with the input of the antenna.

16. The method of claim 15 wherein the matching comprises capacitively coupling the output of the oscillator with ground.

17. The method of claim 12 further comprising selectively providing electrical energy to the oscillator to selectively generate the oscillation signal.

18. The method of claim 12 further comprising:
supplying electrical energy using a battery;
increasing a voltage of the electrical energy; and
providing the electrical energy having the increased voltage to the oscillator.

19. The monitoring device of claim 1 wherein the output node of the signal generation circuitry is an output node of the oscillator.

20. The monitoring device of claim 19 wherein the impedance matching circuitry is configured to receive the oscillation signal directly from the output node.

21. The monitoring device of claim 20 wherein the impedance matching circuitry is configured to provide the oscillation signal directly to the input of the antenna.

22. The monitoring device of claim 1 wherein the wireless signal and the oscillation signal have at least substantially the same frequency.

23. The method of claim 12 wherein the providing comprises providing the oscillation signal directly from the impedance matching circuitry to the input of the antenna.

24. The method of claim 12 wherein the wireless signal and the oscillation signal have at least substantially the same frequency.

25. The method of claim 18 wherein the increasing comprises increasing using a charge pump regulator, and further comprising selectively turning on the charge pump regulator at different moments in time to selectively provide the increasing of the voltage of the electrical energy.

26. The monitoring device of claim 1 wherein the impedance matching circuitry is configured to increase signal strength of the wireless signal.

27. The monitoring device of claim 1 wherein the impedance matching circuitry is configured to reduce reflection of the oscillation signal between the signal generation circuitry and the antenna.

28. The method of claim 12 wherein the matching the impedance increases signal strength of the wireless signal.

29. The monitoring device of claim 21 wherein the inductor is directly coupled with each of the output node of the signal generation circuitry and the input of the antenna.

30. The monitoring device of claim 29 wherein the impedance matching circuitry comprises a capacitor coupled with the output node.

31. The monitoring device of claim 6 wherein the electrical energy having the increased voltage is provided directly from the charge pump regulator to the oscillator.

* * * * *